United States Patent [19]
Kelly

[11] Patent Number: 5,557,577
[45] Date of Patent: Sep. 17, 1996

[54] SYSTEM AND METHOD FOR PERFORMING WAKE-UP OPERATIONS TO A MEMORY

[75] Inventor: James D. Kelly, Aptos, Calif.

[73] Assignee: Apple Computer, Inc., Cupertino, Calif.

[21] Appl. No.: 432,911

[22] Filed: May 1, 1995

[51] Int. Cl.[6] ................................................ G11C 7/00
[52] U.S. Cl. ........................................ 365/222; 364/926.92
[58] Field of Search ........................... 365/222; 364/926.92

[56] References Cited

U.S. PATENT DOCUMENTS

| | | | |
|---|---|---|---|
| 4,918,645 | 4/1990 | Lagoy, Jr. ........................... | 364/926.92 |
| 5,021,951 | 6/1991 | Baba ................................... | 365/222 |
| 5,031,147 | 7/1991 | Maruyama et al. ................. | 365/222 |
| 5,283,885 | 2/1994 | Hollerbauer ........................ | 365/222 |
| 5,345,574 | 9/1994 | Sakurada et al. .................. | 365/222 |
| 5,418,920 | 5/1995 | Kuddes ............................... | 365/222 |

*Primary Examiner*—David C. Nelms
*Assistant Examiner*—Trong Phan
*Attorney, Agent, or Firm*—Burns, Doane, Swecker & Mathis, L.L.P.

[57] ABSTRACT

A system and method are provided which ensure that the required number of refreshes are executed by the memory after powering on. A counter of a refresh processor is initialized to a reset value after completing a reset interval so that the required number of refreshes correspond to high priority requests to ensure that the required number of refreshes will be executed before any other requests. As a result, the system and method ensure that the wake-up period performs the required refreshes after powering on the memory in a simplified and reliable manner.

32 Claims, 2 Drawing Sheets

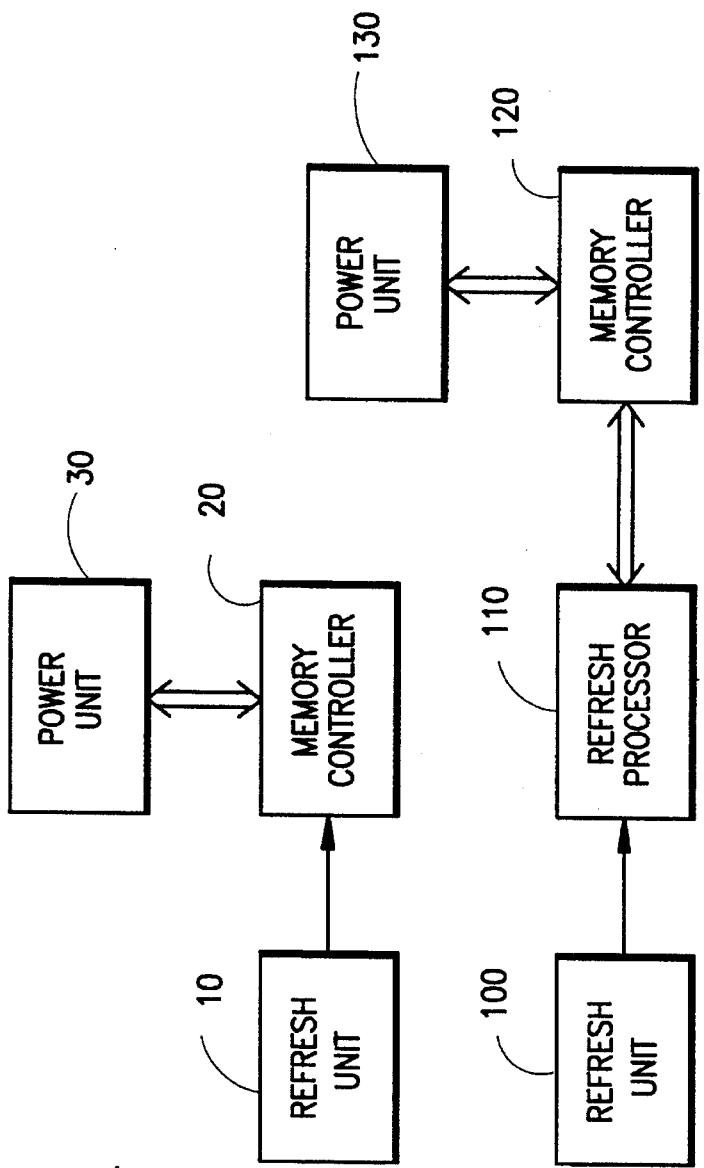
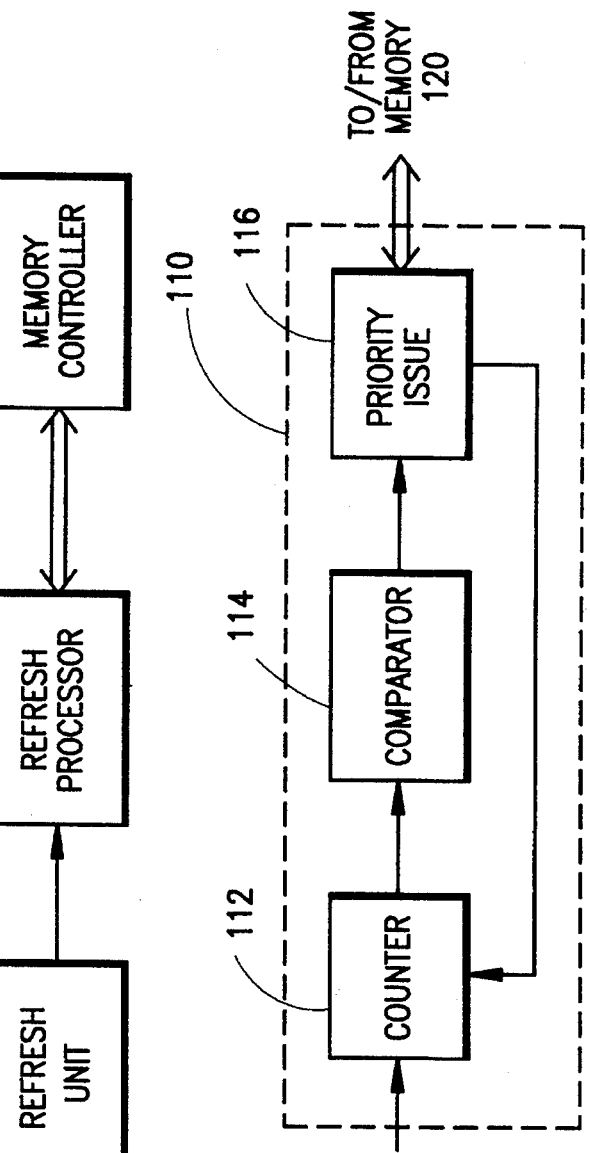
FIG. 1 PRIOR ART
FIG. 2
FIG. 3

SYSTEM AND METHOD FOR PERFORMING WAKE-UP OPERATIONS TO A MEMORY

BACKGROUND

The present invention is directed to a system and method which ensure that the required number of refresh operations are performed to a memory during a wake-up period after powering on the memory by initializing the refresh count value. More particularly, the system and method compare the refresh count value to a predetermined threshold number and by initializing the refresh count value, the required number of refresh requests will be issued as high priority requests to ensure that the required number of refreshes is executed to the memory after powering on.

In conventional dynamic memory systems, the time that a node reliably stores a bit is referred to as the refresh period. The refresh period is based on the particular dynamic memory specifications. Since the charge stored on a dynamic node decays, it is necessary to sense and refresh the dynamic node within the refresh period. Therefore, dynamic memory systems are generally provided with a refresh circuit which generates a refresh request within the refresh period to ensure that the charge on the dynamic node does not decay and the bit remains reliably stored on the dynamic node.

An example of a known refresh operation for a dynamic memory system is illustrated in FIG. 1. A refresh circuit 10 generates refresh requests at predetermined intervals to the memory controller 20. The predetermined intervals are chosen to be within the refresh period to ensure that data on the dynamic node reliably remains. Conventionally, the predetermined intervals are about 15 μsec. More specifically, the refresh circuit 10 generates an overflow signal at the end of the predetermined intervals. The generated overflow signals act as refresh requests which take priority before all of the other requests from an external processor (not shown). In these known systems, because the refresh requests take priority in the execution by the memory controller 20 before all of requests, the read latency is adversely affected due to the refreshes. For example, in the middle of a large block transfer, a read which conflicts with the refresh will be forced to wait until the refresh is completed because the refresh has priority. The amount of time necessary to complete the refresh is dependent upon the number of banks in the dynamic memory and thereby, the read latency becomes higher as the number of banks is increased.

FIG. 1 further illustrates a power unit 30 for powering on the memory controller 20. Upon powering on a dynamic memory, it is necessary to perform a wake-up operation where the dynamic memory does not operate for a certain amount of time and then a required number of refreshes are sequentially directed to the memory controller 20. Typically, the time period for which the dynamic memory does not receive requests is 200 μsec and a number of refresh cycles is executed by the memory controller 20 for the wake-up operation. The required number of refresh cycles in the wake-up operation are executed so that the sense amplifiers of the dynamic memory are precharged. The required number of refreshes is set by the product's manufacturer and this number is typically 8 refresh cycles. However, in conventional memory controllers, it is usually assumed that the refresh cycles will occur during the reset interval but there is no circuitry for ensuring that the required number of refresh cycles will always occur.

To reduce the amount and complexity of circuitry used for the wake-up operation, it is desired to utilize other circuitry for more than one function for ensuring the required number of refresh cycles is performed. The embodiments of the present invention are directed to utilizing a refresh processor to ensure that the required number of refreshes are performed to a memory with simplified circuitry.

SUMMARY

An object of the present invention is to provide a system and controller which ensure that the required number of refreshes are performed to a memory during a wake-up operation after powering on the memory by associating high priority requests with the required number of refreshes generated immediately after the reset interval.

Another object of the present invention is to provide a system and method which prioritize and issue refresh requests to the memory for ensuring that the required number of refreshes is issued to the memory after powering on.

These objects of the present invention are fulfilled by providing a system for powering up a memory, comprising a resetting unit for generating a reset interval in response to powering on the memory, and a refresh counter having a refresh count value which is set to an initialized refresh value upon completing the reset interval to ensure that a required number of refreshes are executed by the memory after powering on the memory. As a result, this system ensures that the required number of refreshes is performed to the memory during the wake-up period after powering on the memory without the use of complicated timing circuitry.

These objects of the present invention are also fulfilled by providing a method for powering on a memory comprising the steps of generating a reset interval in response to powering on the memory, and setting a refresh count value of a refresh counter to an initialized refresh value upon completing said refresh interval to ensure that a required number of refreshes is executed as high priority requests by the memory after powering on. This method processes the required number of refreshes issued immediately after the reset interval as high priority requests to ensure that the required number of refreshes are executed by the memory during the wake-up period in a simplified and reliable manner.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this derailed description.

BRIEF DESCRIPTION OF THE DRAWINGS

The present invention will become more fully understood from the derailed description given hereinbelow and the accompanying drawings which are given by way of illustration only, and thus are not limitative of the invention, wherein:

FIG. 1 illustrates a known system for powering on a memory device;

FIG. 2 illustrates a system for powering on a memory according to an embodiment of the present invention;

FIG. 3 illustrates a more detailed block diagram of the refresh processor illustrated in FIG. 2 for an embodiment of the present invention.

DETAILED DESCRIPTION

Figure 4A:
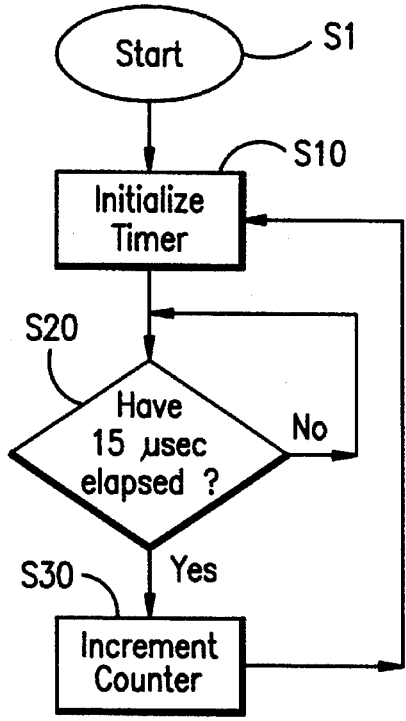
FIGS. 4(a) and 4(b) illustrate flow charts of the wake-up operation performed after powering on the memory in an embodiment of the present invention.

A system for powering on a memory is shown in FIG. 2 according to an embodiment of the present invention. FIG. 2 illustrates a refresh circuit 100 for generating refresh requests, a refresh processor 110 for receiving the refresh requests from the refresh circuit 100 and issuing the refresh requests with a corresponding priority and a memory controller 120 which receives the refresh requests along with the corresponding priority from the refresh processor 110. The refresh processor 110 generates a high priority, which allows the refresh request to issue before all of the other pending requests to the memory controller 110, and a low priority request, which allows the refresh request to be issued to the memory controller 120 only when there are no other pending requests. The system also includes a power unit 130 for powering on the memory controller 120 and performing initial operations such as initiating the reset interval and the wake-up operation. The memory controller 120 may control a dynamic memory such as a DRAM, a VRAM, or a synchronous DRAM.

The normal operation of the refresh circuit 100 for generating refresh requests at predetermined intervals is similar to the refresh circuit in known DRAM systems. The refresh circuit 100 generates refresh requests at predetermined intervals by generating an overflow signal at the end of each predetermined interval, for example. The predetermined interval is conventionally 15 μsec. The refresh processor 110 receives the refresh requests from the refresh circuit 100 and processes the refresh requests as either high or low priority requests based on the number of pending refresh requests to the memory controller 120. For example, if the number of pending refresh requests is three or more, a high priority request is issued, and if the number of pending refresh requests is less than three, a low priority request is issued. Finally, the memory controller 120 receives the refresh requests and the corresponding priority for possible execution of the refresh requests by the memory controller 120. The refresh requests issued as high priority requests are executed by the memory 120 before all other pending requests and the refresh requests issued as low priority requests are executed by the memory controller 120 only when there are no other pending requests. As a result, the overall forward progress of the refresh operation is guaranteed while the read latency to the memory controller 120 is lowered.

The power unit 130 performs the required wake-up operation after powering on the memory controller 120. The wake-up operation includes a period of time where the memory controller 120 is powered on but does not perform any operations and a time interval where a predetermined number of refresh cycles are executed by the memory controller 120. In a typical example, the initial period of time when the memory controller 120 is powered on doing nothing is 200 μsec followed by 8 refresh cycles. The powering on operation also includes a reset interval which is typically 200 msec. Since the period of time for the reset interval is longer than the required part of the wake-up operation where the memory is powered on and doing nothing, this required part of the wake-up operation is met by the reset interval. After this reset interval, the required number of refresh cycles must be performed to complete the wake-up operation for the memory controller 120.

FIG. 3 shows a more detailed block diagram of the refresh processor 110. FIG. 3 illustrates the refresh processor 110 to include a counter 112, a comparator 114, and a priority issuing unit 116. The counter 112 receives the refresh requests from the refresh circuit 100 at the predetermined intervals and increments the counter 112 by one every time that a refresh request is received. The comparator 114 compares the value of the counter 112 with a predetermined threshold number to determine whether the refresh request should be issued as a high or low priority request. If the value of the counter 112 is determined to be greater than or equal to the predetermined threshold number by the comparator 114, the refresh request is sent to the memory controller 120 from the priority issuing unit 116 as a high priority request. However, if the counter value is determined to be less than the predetermined threshold number by the comparator 114, the priority issuing unit 116 issues the refresh request to the memory 120 as a low priority request. Also, the priority issuing unit 116 decrements the count value after a refresh is executed by the memory controller 120. The priority issuing unit 116 includes an execution detecting portion (not shown) for detecting whether the issued refresh request is executed by the memory controller 120. The refresh processor 110 issues the refresh requests to the memory controller 120 as high and low priority requests based on the number of pending refresh requests such that the high priority refresh requests are executed by the memory 120 before all other pending requests and the low priority refresh requests are executed by the memory 120 only when there fails to be any other pending requests.

To ensure that the required number of refresh cycles are performed during the wake-up operation, the predetermined threshold number is initialized to a start up refresh value upon completion of the reset interval. In a typical example, the predetermined threshold number is set to 3 and the required number for refreshes to be performed is set to 8. Thereby, the value of the counter 112 is initialized to a refresh value of 11. Accordingly, the required wake-up operation is performed by initializing the refresh processor 110 to ensure that the required number of refreshes is executed as high priority requests by the memory 120 after powering on.

Figure 4B:
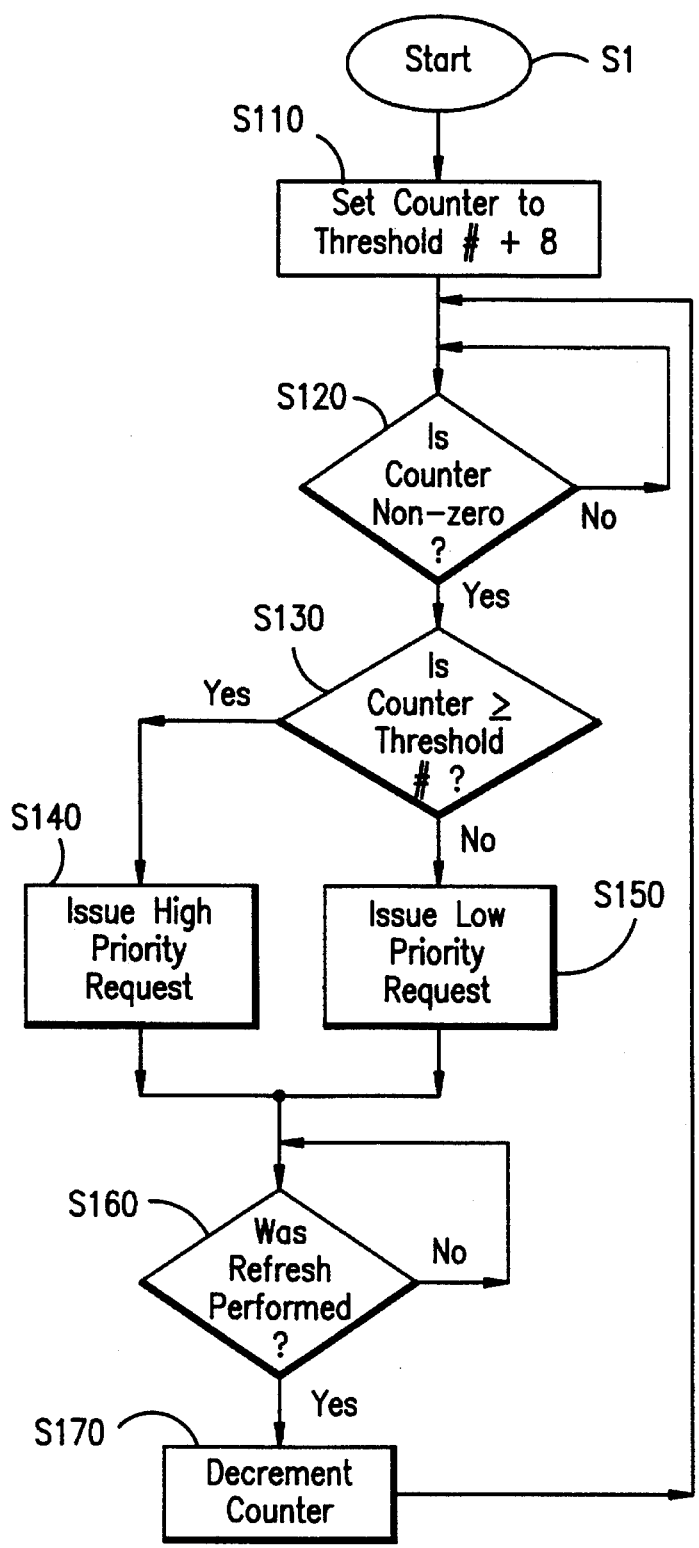

FIGS. 4(a) and 4(b) illustrate flow charts of the concurrent processes performed by the refresh controller. In FIG. 4(a), the timer is initialized at step S10 by being reset to zero. At step S20, it is determined whether 15 microseconds have elapsed. If 15 μsec have not elapsed, checking for whether 15 μsec have elapsed at step S20 is repeatedly cycled until the 15 μsec have elapsed. After it is determined at step S20 that the 15 μsec have elapsed, the counter 112 is incremented at step S30. Concurrently with incrementing the counter when the timer overflows, the refresh requests are prioritized as shown in FIG. 4(b). At step S110, the counter 112 is set to the predetermined threshold number+8 (the required number of refresh cycles). It is determined at step S120 whether the counter 112, as incremented in the process shown in FIG. 4(a), is not zero. If the counter 112 is zero, step S120 is repeatedly cycled until the counter 112 is incremented and becomes non-zero. When the counter 112 is determined to be non-zero at step S120, the value of the counter 112 is compared with the predetermined threshold number. If the value of the counter 112 is greater than or equal to the predetermined threshold number, a high priority request is issued at step S140. If the counter is less than the predetermined threshold number, a low priority request is issued at step S150. Next, it is determined at step S160 whether the refresh was performed. If the refresh was not performed, step S160 is repeatedly cycled until the refresh is performed. After performing the refresh at step S160, the counter 112 is decremented by 1 at step S170 and proceeds back to step S120.

The system and method described in the embodiments of the present invention ensure that required number of refresh requests are executed by a memory during a wake-up operation after powering on the memory. The system and method for these embodiments are especially applicable to dynamic memories where the refresh requests make certain that the bits stored at the dynamic node will not decay and thereby remain reliable. Therefore, a counter of a refresh processor is initialized to a refresh value which ensures that the required number of refreshes is executed as high priority requests after powering on the memory. By utilizing the counter of the refresh processor, the complexity of the circuitry is reduced and the required number of refreshes during the wake-up period is more reliably performed.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A system for powering on a memory comprising:
   a resetting unit for initiating a reset interval in response to powering on the memory; and
   a refresh counter having a refresh count value which is set to an initialized refresh value upon completing said reset interval to ensure that a required number of refreshes is executed as high priority requests by the memory after powering on.

2. A system according to claim 1, further comprising:
   a refresh circuit for generating refresh requests;
   a refresh comparator for comparing said refresh count value to a predetermined threshold number;
   a prioritizing unit for issuing said refresh requests to the memory as high priority requests when said refresh count value is greater than or equal to said predetermined threshold number and as low priority requests when said refresh count value is less than said predetermined threshold number; and
   a refresh detector for detecting whether the memory has executed said refresh requests, said refresh count value being decremented by one for each of said refresh requests that is executed and said refresh count value being incremented by one for each of said refresh requests that fails to be executed and thereby becomes pending.

3. A system according to claim 1, wherein the memory comprises a dynamic memory.

4. A system according to claim 2, wherein said refresh circuit generates said refresh requests at predetermined time intervals.

5. A system according to claim 4, wherein said predetermined time intervals are 15 μsec.

6. A system according to claim 2, wherein said refresh requests issued as high priority requests are executed before all other pending requests to the memory and said refresh requests issued as low priority requests are executed only when there fails to be any other pending requests to the memory.

7. A system according to claim 1, wherein said reset interval comprises a wake-up period.

8. A system according to claim 7, wherein said reset interval is 200 μsec and said wake-up period is 200 μsec.

9. A system according to claim 1, wherein said required number of refreshes is 8, said initialized refresh value is 11 and said predetermined threshold number is 3.

10. A system for prioritizing refresh requests upon powering on a memory, comprising:
    a refresh circuit for generating refresh requests; and
    a refresh processor for prioritizing and issuing said refresh requests to the memory based on a refresh count value, said refresh processor setting said refresh count value to an initialized refresh value after a reset interval is completed to ensure that a required number of refreshes is executed by the memory after powering on.

11. A system according to claim 10, wherein said refresh processor includes,
    a refresh counter for counting the number of pending refresh requests to the memory, and adjusting said refresh count value in response to the number of pending refresh requests,
    a refresh comparator for comparing said refresh count value to a predetermined threshold number, and
    a prioritizing unit for issuing said refresh requests to the memory as first priority requests when said refresh count value is greater than or equal to said predetermined threshold number and as second priority requests when said refresh count value is less than said predetermined threshold number.

12. A system according to claim 11, wherein said first priority requests enable said refresh requests to be executed before all other pending requests and said second priority requests enable said refresh requests to be executed only when there fails to be any other pending requests to the memory.

13. A system according to claim 11, wherein refresh counter decrements said refresh count value by one for each of said refresh requests that is executed and increments said refresh count value by one for each of said refresh requests that fails to be executed and thereby becomes pending.

14. A system according to claim 10, wherein the memory comprises a dynamic memory.

15. A system according to claim 10, further comprising a resetting unit for generating said reset interval in response to powering on the memory.

16. A system according to claim 15, wherein said reset interval comprises a wake-up period.

17. A method for powering on a memory comprising the steps of:
    (a) initiating a reset interval in response to powering on the memory; and
    (b) setting a refresh count value of a refresh counter to an initialized refresh value upon completing said reset interval to ensure that a required number of refreshes is executed as high priority requests by the memory after powering on.

18. A method according to claim 17, further comprising the steps of:
    (c) generating refresh requests;
    (d) comparing said refresh count value to a predetermined threshold number;
    (e) issuing said refresh requests to the memory as high priority requests when said refresh count value is greater than or equal to said predetermined threshold number and as low priority requests when said refresh count value is less than said predetermined threshold number;

(f) detecting whether the memory has executed said refresh requests; and (g) decrementing said refresh count value by one for each of said refresh requests that are detected to be executed at said step (f), and incrementing said refresh count value by one for each of said refresh requests that is detected as failing to have been executed at said step (f) and thereby becomes pending.

19. A method according to claim 17, wherein the memory comprises a dynamic memory.

20. A method according to claim 18, wherein said step (c) generates said refresh requests at predetermined time intervals.

21. A method according to claim 20, wherein said predetermined time intervals are 15 μsec.

22. A method according to claim 18, wherein said high priority requests issued at said step (e) are executed before all other pending requests to the memory and said low priority requests issued at said step (e) are executed only when there fails to be any other pending requests to the memory.

23. A method according to claim 17, wherein said reset interval comprises a wake-up period.

24. A method according to claim 23, wherein said reset interval is 200 msec and said wake-up period is 200 μsec.

25. A method according to claim 17, wherein said required number of refreshes is 8, said initialized refresh value is 11 and said predetermined priority number is 3.

26. A method for prioritizing refresh requests upon powering on a memory, comprising the steps of:

(a) generating refresh requests; and (b) prioritizing and issuing said refresh requests to the memory based on a refresh count value by setting said refresh count value to an initialized refresh value after a reset interval is completed to ensure that a required number of refreshes is executed by the memory after powering on.

27. A method according to claim 26, wherein said step (b) further includes the steps of:

(b)(1) counting the number of pending refresh requests to the memory, (b)(2) adjusting said refresh count value in response to the number of pending refresh requests, (b)(3) comparing said refresh count value to a predetermined threshold number, and (b)(4) issuing said refresh requests to the memory as first priority requests when said refresh count value is greater than or equal to said predetermined threshold number and as second priority requests when said refresh count value is less than said predetermined threshold number.

28. A method according to claim 27, wherein said first priority requests enable said refresh requests to be executed before all other pending requests and said second priority requests enable said refresh requests to be executed only when there fails to be any other pending requests to the memory.

29. A method according to claim 27, wherein said step (b)(2) decrements said refresh count value by one for each of said refresh requests that is executed and increments said refresh count value by one for each of said refresh requests that fails to be executed and thereby becomes pending.

30. A method according to claim 26, wherein the memory comprises a dynamic memory.

31. A method according to claim 26, further comprising the step of generating said reset interval in response to powering on the memory.

32. A method according to claim 31, wherein said reset interval comprises a wake-up period.

* * * * *